(12) United States Patent
Lee et al.

(10) Patent No.: US 9,455,302 B2
(45) Date of Patent: Sep. 27, 2016

(54) IMAGE SENSOR AND ELECTRONIC DEVICE INCLUDING THE SAME

(71) Applicant: Samsung Electronics Co., Ltd., Suwon-Si, Gyeonggi-Do (KR)

(72) Inventors: Kwang-hee Lee, Yongin-si (KR); Kyung Bae Park, Hwaseong-si (KR); Gae Hwang Lee, Seongnam-si (KR); Dong-Seok Leem, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/584,290

(22) Filed: Dec. 29, 2014

(65) Prior Publication Data

US 2016/0049448 A1 Feb. 18, 2016

(30) Foreign Application Priority Data

Aug. 12, 2014 (KR) .................. 10-2014-0104386

(51) Int. Cl.
*H01L 29/49* (2006.01)
*H01L 27/30* (2006.01)
*H01L 51/44* (2006.01)

(52) U.S. Cl.
CPC .......... *H01L 27/307* (2013.01); *H01L 51/442* (2013.01); *H01L 2251/301* (2013.01)

(58) Field of Classification Search
CPC ................................................... H01L 27/307
See application file for complete search history.

(56) References Cited

U.S. PATENT DOCUMENTS

| | | | |
|---|---|---|---|
| 5,705,826 A * | 1/1998 | Aratani | H01L 51/0035 257/40 |
| 6,300,612 B1 | 10/2001 | Yu | |
| 7,129,466 B2 | 10/2006 | Iwasaki | |
| 7,154,157 B2 * | 12/2006 | Bradski | H01L 27/14647 257/440 |
| 7,667,750 B2 | 2/2010 | Goto et al. | |
| 7,737,391 B2 | 6/2010 | Hsu et al. | |
| 7,795,069 B2 | 9/2010 | Jun | |
| 8,035,708 B2 | 10/2011 | Takizawa et al. | |
| 8,513,762 B2 | 8/2013 | Qian et al. | |
| 9,130,175 B2 * | 9/2015 | Lee | H01L 51/0072 |

(Continued)

FOREIGN PATENT DOCUMENTS

| | | | |
|---|---|---|---|
| JP | 6-163903 | * | 6/1994 |
| KR | 100855408 B1 | | 8/2008 |

(Continued)

OTHER PUBLICATIONS

European Search Report mailed on Jan. 4, 2016, for the corresponding European Patent Application No. 15150278.8.

*Primary Examiner* — Michael Shingleton
(74) *Attorney, Agent, or Firm* — Harness, Dickey & Pierce, P.L.C.

(57) ABSTRACT

Example embodiments relate to an image sensor that includes a semiconductor substrate integrated with at least one photo-sensing device, an impurity-doped first light-transmitting electrode present in the semiconductor substrate, an organic photoelectric conversion layer positioned on one side of the semiconductor substrate and absorbing light in a different wavelength from the wavelength sensed by the photo-sensing device, and a second light-transmitting electrode positioned on one side of the organic photoelectric conversion layer, and an electronic device including the same.

20 Claims, 4 Drawing Sheets

(56) References Cited

U.S. PATENT DOCUMENTS

| | | | |
|---|---|---|---|
| 9,142,594 B2* | 9/2015 | Imai | H01L 27/307 |
| 2005/0205903 A1* | 9/2005 | Hioki | H01L 27/14647 257/291 |
| 2007/0279501 A1 | 12/2007 | Goto et al. | |
| 2008/0035965 A1* | 2/2008 | Hayashi | H01L 27/14647 257/291 |
| 2008/0246853 A1 | 10/2008 | Takizawa et al. | |
| 2009/0085029 A1* | 4/2009 | Mitsui | H01L 51/0051 257/40 |
| 2009/0283758 A1* | 11/2009 | Nomura | C07D 407/06 257/40 |
| 2010/0102303 A1* | 4/2010 | Nomura | C07D 277/30 257/40 |
| 2010/0117126 A1* | 5/2010 | Takahashi | H01L 27/14609 257/292 |
| 2011/0006386 A1* | 1/2011 | Lee | C08F 2/44 257/432 |
| 2011/0019042 A1* | 1/2011 | Yamaguchi | H01L 27/14632 348/280 |
| 2013/0033628 A1* | 2/2013 | Yamaguchi | H01L 27/14632 348/294 |
| 2013/0087682 A1* | 4/2013 | Nomura | C09B 23/105 250/206 |
| 2014/0001454 A1* | 1/2014 | Miyanami | H01L 27/286 257/40 |
| 2014/0070783 A1* | 3/2014 | Stueve | H02M 3/156 323/282 |
| 2014/0204259 A1* | 7/2014 | Mitsui | H01L 27/307 348/311 |
| 2014/0206128 A1* | 7/2014 | Nakatani | H01L 27/305 438/66 |
| 2014/0231782 A1* | 8/2014 | Imai | H01L 51/448 257/40 |
| 2014/0239156 A1* | 8/2014 | Hayashi | H01L 27/14605 250/208.1 |
| 2014/0264298 A1* | 9/2014 | Park | H01L 51/44 257/40 |
| 2014/0306276 A1* | 10/2014 | Yamaguchi | H01L 27/1464 257/292 |
| 2014/0353651 A1* | 12/2014 | Takimoto | H01L 51/448 257/40 |
| 2014/0367668 A1* | 12/2014 | Fujii | H01L 27/14627 257/40 |
| 2014/0374733 A1* | 12/2014 | Hirai | C07D 221/18 257/40 |
| 2014/0375826 A1* | 12/2014 | Lee | H01L 27/307 348/207.1 |
| 2015/0001376 A1* | 1/2015 | Miyanami | H01L 27/14643 250/208.1 |
| 2015/0042855 A1* | 2/2015 | Baek | H04N 5/23293 348/294 |
| 2015/0076500 A1* | 3/2015 | Sakaida | H01L 27/14612 257/59 |
| 2015/0115243 A1* | 4/2015 | Miyanami | H01L 51/448 257/40 |
| 2015/0129861 A1* | 5/2015 | Hamano | C07F 7/30 257/40 |
| 2015/0221702 A1* | 8/2015 | Jung | H01L 27/286 257/40 |
| 2015/0256769 A1* | 9/2015 | Kim | H04N 5/335 348/302 |
| 2015/0270214 A1* | 9/2015 | Chuang | H01L 23/5226 257/774 |

FOREIGN PATENT DOCUMENTS

| | | |
|---|---|---|
| KR | 101010443 B1 | 1/2011 |
| WO | WO-2014-103240 A1 | 7/2014 |

* cited by examiner

IMAGE SENSOR AND ELECTRONIC DEVICE INCLUDING THE SAME

This application claims benefit of priority to Korean Patent Application No. 10-2014-0104386 filed in the Korean Intellectual Property Office on Aug. 12, 2014, the entire contents of which are incorporated herein by reference.

BACKGROUND

1. Field

An image sensor and/or an electronic device including the same are disclosed.

2. Description of the Related Art

A photoelectric device converts light into an electrical signal using photoelectric effects, may include a photodiode, a phototransistor, and the like, and may be applied to an image sensor, a solar cell, and the like.

An image sensor including a photodiode generally requires a small size and high resolution and thus a size of a pixel may have to become smaller. However, currently-used silicon photodiodes typically have a small pixel size, and thus sensitivity may be decreased due to a decreased absorption area. Accordingly, an organic photoelectric device that is capable of replacing at least one part of the silicon photodiode has been researched.

However, the silicon photodiode is formed with an organic photoelectric device, and thus a process may become complicated and loss of light incident into an image sensor may become large.

SUMMARY

At least one example embodiment provides a small size image sensor that is capable of decreasing light loss and simplifying a process.

According to another example embodiment, an electronic device including the image sensor is provided.

According to at least one example embodiment, an image sensor includes a semiconductor substrate integrated with at least one photo-sensing device, an impurity-doped first light-transmitting electrode present in the semiconductor substrate, an organic photoelectric conversion layer positioned on one side of the semiconductor substrate and absorbing light in a different wavelength from the wavelength sensed by the photo-sensing device, and a second light-transmitting electrode positioned on one side of the organic photoelectric conversion layer.

The first light-transmitting electrode, the organic photoelectric conversion layer, and the second light-transmitting electrode may form an organic photoelectric device.

The first light-transmitting electrode may be positioned at the surface of the semiconductor substrate, and may include n-type or p-type impurity-doped amorphous silicon.

The first light-transmitting electrode may have a thickness of about 2 nm to about 50 nm.

The photo-sensing device integrated in the semiconductor substrate may include a first photo-sensing device sensing light in a first wavelength region and a second photo-sensing device sensing light in a second wavelength region that is different from the first wavelength region, wherein the organic photoelectric conversion layer may absorb light in a third wavelength region that is different from the first wavelength region and the second wavelength region.

The first photo-sensing device and the second photo-sensing device may be positioned at different depths from the surface of the semiconductor substrate.

The first photo-sensing device may sense light in a longer wavelength region than the second photo-sensing device, and the first photo-sensing device may be positioned more deeply from the surface of the semiconductor substrate than the second photo-sensing device.

The image sensor may further include a selectively transmitting region positioned between the first photo-sensing device and the first light-transmitting electrode.

The selectively transmitting region may selectively transmit light in the first wavelength region and may selectively reflect or absorb light in the second wavelength region.

The selectively transmitting region may include crystalline silicon.

The first light-transmitting electrode may include amorphous silicon, and the selectively transmitting region may include crystalline silicon.

The image sensor may further include a color filter layer positioned on one side of the second light-transmitting electrode.

The color filter layer may include a first color filter that is positioned corresponding to the first photo-sensing device and that selectively transmits light in the first wavelength region and the third wavelength region, and a second color filter that is positioned corresponding to the second photo-sensing device and that selectively transmits light in the second wavelength region and the third wavelength region.

The first photo-sensing device and the second photo-sensing device may be spaced apart from each other in a horizontal direction.

An insulation layer may be omitted between the semiconductor substrate and the organic photoelectric conversion layer.

An organic color filter may be omitted between the semiconductor substrate and the organic photoelectric conversion layer.

The first wavelength region, the second wavelength region, and the third wavelength region may be one of three primary colors in each visible ray region.

The first wavelength region may be a red wavelength region, the second wavelength region may be a blue wavelength region, and the third wavelength region may be a green wavelength region.

The red wavelength region may have a maximum absorption wavelength ($\lambda_{max}$) of greater than about 580 nm and less than or equal to about 700 nm, the blue wavelength region may have a maximum absorption wavelength ($\lambda_{max}$) of greater than or equal to about 400 nm and less than about 500 nm, and the green wavelength region may have a maximum absorption wavelength ($\lambda_{max}$) of about 500 nm to about 580 nm.

According to another example embodiment, an electronic device including the image sensor is provided.

DETAILED DESCRIPTION

Figure 1:
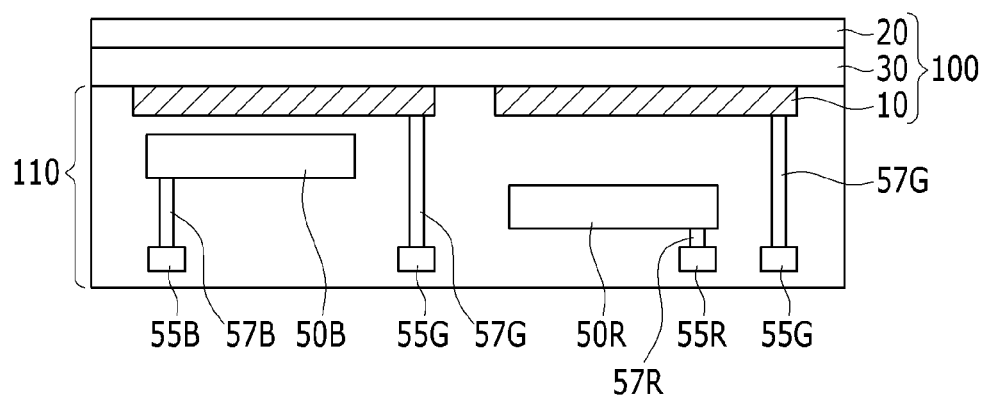
FIG. 1 is a cross-sectional view showing an image sensor according to at least one example embodiment.

Example embodiments will be hereinafter described in detail, and may be easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Referring to drawings, an image sensor according to one embodiment will now be described. Herein, a CMOS image sensor as an example of an image sensor is described.

FIG. 1 is a cross-sectional view showing an image sensor according to at least one example embodiment.

Referring to FIG. 1, an image sensor according to one example embodiment includes a semiconductor substrate 110, a lower electrode 10 formed in the semiconductor substrate 110, an organic photoelectric conversion layer 30 positioned on one side of the semiconductor substrate 110, and an upper electrode 20 formed on one side of the organic photoelectric conversion layer 30.

The semiconductor substrate 110 may be a silicon substrate, for example a monocrystalline silicon substrate. The semiconductor substrate 110 may be integrated with a blue photo-sensing device 50B, a red photo-sensing device 50R, charge storages 55B, 55R, and 55G, and a transmission transistor (not shown). The blue photo-sensing device 50B and the red photo-sensing device 50R may be, for example, photodiodes.

The blue photo-sensing device 50B, the charge storage 55B, and the transmission transistor may be integrated in each blue pixel, and the blue photo-sensing device 50B may be electrically connected to the charge storage 55B through a through-hole 57B. The red photo-sensing device 50R, the charge storage 55R, and the transmission transistor may be integrated in each red pixel, and the red photo-sensing device 50R may be electrically connected to the charge storage 55R through a through-hole 57R. The charge storage 55G may be electrically connected to the lower electrode 10 through a through-hole 57G.

The blue photo-sensing device 50B and the red photo-sensing device 50R may be positioned at different depths from the surface of the semiconductor substrate 110, and the red photo-sensing device 50R, which is configured to sense light in a longer wavelength region, may be positioned more deeply from the surface of the semiconductor substrate 110 than the blue photo-sensing device 50B, which is configured to sense light in a shorter wavelength region. The blue photo-sensing device 50B and the red photo-sensing device 50R may selectively absorb light in each wavelength region depending on a stack depth.

On the other hand, the red photo-sensing device 50R is positioned at a desired, or alternatively predetermined depth from the surface of the semiconductor substrate 110, and thereby a crystalline silicon region, such as a monocrystal or a polycrystal and having a desired, or alternatively predetermined thickness, may be positioned on the red photo-sensing device 50R, and the crystalline silicon region increases reflectance for light in a short wavelength region, that is, a blue wavelength region, and increases wavelength selectivity of light that inflows into the red photo-sensing device 50R.

The lower electrode 10 may be disposed in each pixel, and may be a conductive layer doped with an n-type or p-type impurity at a high concentration on the surface of the semiconductor substrate 110. For example, the lower electrode 10 may be amorphous silicon doped with an n-type or p-type impurity. The amorphous silicon may have a low reflectance or absorption in a visible ray region including a red wavelength region, a green wavelength region, and a blue wavelength region, and may thereby have a high light transmittance. The n-type impurity may be, for example, phosphorus (P), arsenic (As), and/or antimony (Sb), and the p-type impurity may be, for example, boron (B), aluminum (Al), and/or gallium (Ga), but are not limited thereto. The n-type or p-type impurity may be doped at a concentration, for example, of greater than or equal to about $1*10^{14}/cm^2$, for another example, about $5*10^{14}/cm^2$ to about $9*10^{16}/cm^2$.

The lower electrode 10 may be a light-transmitting electrode, and may have a thickness, for example, of about 2 nm to about 50 nm.

The organic photoelectric conversion layer 30 may be configured to selectively absorb light in a green wavelength region and transmit light in other wavelength regions, that is, light in a blue wavelength region and a red wavelength region.

The organic photoelectric conversion layer 30 may include, for example, a p-type semiconductor and an n-type semiconductor, and the p-type semiconductor and the n-type semiconductor may form a pn junction. At least one of the p-type semiconductor and the n-type semiconductor may selectively absorb light in a green wavelength region to generate excitons, and then the generated excitons may be separated into holes and electrons to provide a photoelectric effect.

The p-type semiconductor and the n-type semiconductor may respectively have, for example, an energy bandgap of about 2.0 to about 2.5 eV, and the p-type semiconductor and the n-type semiconductor may have a lowest occupied molecular orbital (LUMO) difference of, for example, about 0.2 to about 0.9 eV.

The p-type semiconductor material may be, for example, quinacridone or a derivative thereof, or sub-phthalocyanine or a derivative thereof, and the n-type semiconductor material may be, for example, a cyanovinyl group-containing thiophene derivative, sub-phthalocyanine or a derivative thereof, or fullerene or a fullerene derivative, but are not limited thereto.

The organic photoelectric conversion layer 30 may be a single layer or a multilayer. The organic photoelectric conversion layer 30 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a thickness ratio of about 1:100 to about 100:1. The semiconductors may be included in a thickness ratio ranging from about 1:50 to about 50:1 within the range, specifically, about 1:10 to about 10:1, and more specifically, about 1 to about 1. When the p-type and n-type semiconductors have a composition ratio within the range, an exciton may be effectively produced, and a pn junction may be effectively formed.

The p-type layer may include the p-type semiconductor, and the n-type layer may include the n-type semiconductor.

The organic photoelectric conversion layer 30 may have a thickness of about 1 nm to about 500 nm. Within the range, the organic photoelectric conversion layer 30 may have a thickness of about 5 nm to about 300 nm. When the organic photoelectric conversion layer 30 has a thickness within the range, the organic photoelectric conversion layer 30 may effectively absorb light, effectively separate holes from electrons, and deliver them, effectively improving photoelectric conversion efficiency.

The upper electrode 20 may be positioned on the organic photoelectric conversion layer 30 and may be a light-transmitting electrode into which light enters. The upper electrode 20 may be made of, for example, a transparent conductor such as indium tin oxide (ITO) or indium zinc oxide (IZO), and it may be a metal thin layer having a thin thickness of several nanometers or several tens of nanometers or a metal thin layer having a thin thickness of several nanometers to several tens of nanometers doped with a metal oxide. One of the lower electrode 10 and the upper electrode 20 is an anode and the other is a cathode.

The lower electrode 10, the organic photoelectric conversion layer 30, and the upper electrode 20 provide an organic photoelectric device, and when light is incident from the upper electrode 20 and the organic photoelectric conversion layer 30 adsorbs light in a green wavelength region, excitons may be produced from the inside. The excitons are separated into holes and electrons in the organic photoelectric conversion layer 30, and the separated holes are transported to an anode that is one of the lower electrode 10 and the upper electrode 20, and the separated electrons are transported to the cathode that is the other of the lower electrode 10 and the upper electrode 20 so as to flow a current. The separated electrons or holes may be collected in the charge storage 55G. Light in other wavelength regions except for a green wavelength region pass through the lower electrode 10, and may be sensed by the blue photo-sensing device 50B or the red photo-sensing device 50R.

The organic photoelectric device 100 may be formed on the front of the image sensor, and thus increase a light absorption area and bring about high absorption efficiency.

In FIG. 1, the blue photo-sensing device 50B sensing light in a blue wavelength region and the red photo-sensing device 50R sensing light in a red wavelength region are integrated in the semiconductor substrate 110, and the organic photoelectric device 100 includes the organic photoelectric conversion layer 30 selectively absorbing light in a green wavelength region. However, the organic photoelectric device 100 is not limited to the above structure shown in FIG. 1. A photo-sensing device sensing light in a blue wavelength region and a photo-sensing device sensing light in a green wavelength region may be integrated in the semiconductor substrate 110, and the organic photoelectric device 100 may include an organic photoelectric conversion layer selectively absorbing light in a red wavelength region. Alternatively, a photo-sensing device sensing light in a red wavelength region and a photo-sensing device sensing light in a green wavelength region may be integrated in the semiconductor substrate 110, and the organic photoelectric device 100 may include an organic photoelectric conversion layer selectively absorbing light in a blue wavelength region.

According to at least one example embodiment, the red wavelength region may have a maximum absorption wavelength ($\lambda_{max}$) of greater than about 580 nm and less than or equal to about 700 nm, the blue wavelength region may have a maximum absorption wavelength ($\lambda_{max}$) of greater than or equal to about 400 nm and less than about 500 nm, and the green wavelength region may have a maximum absorption wavelength ($\lambda_{max}$) of about 500 nm to about 580 nm.

The image sensor according to an example embodiment includes the conductive layer on the surface of the semiconductor substrate 110 such that the conductive layer is used as one electrode of the organic photoelectric device 100, and thus its structure and process may be simplified as described above. In addition, a separate insulation layer between the semiconductor substrate 110 and the organic photoelectric device 100 may not be formed by the above structure, and light absorption and/or reflection by the insulation layer are decreased, reducing loss of light that flows into the semiconductor substrate.

The blue photo-sensing device 50B and the red photo-sensing device 50R integrated in the semiconductor substrate 110 may be positioned at different depths from the surface of the semiconductor substrate 110 and selectively absorb light in each wavelength region depending on a stack depth, and thereby color separation characteristics are improved without having to add a separate organic color filter layer.

Furthermore, as described above, the crystalline silicon region having a desired, or alternatively predetermined thickness on the red photo-sensing device 50R increases reflectance of light in a short wavelength region, that is, a blue wavelength region, and thereby wavelength selectivity of light that flows into the red photo-sensing device 50R increases and color separation characteristics may be improved without a color filter. Accordingly, the structure and process of the image sensor may be simplified.

Figure 2:
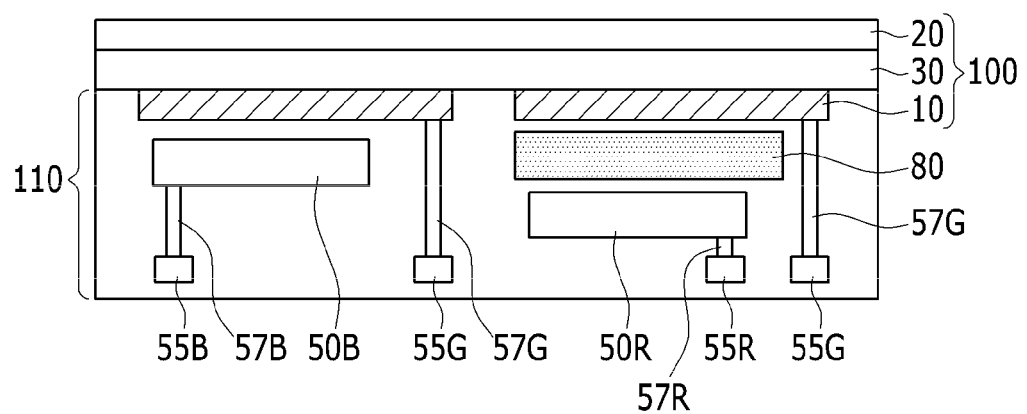
FIG. 2 is a cross-sectional view showing an image sensor according to another example embodiment.

FIG. 2 is a cross-sectional view showing an image sensor according to another example embodiment.

Referring to FIG. 2, an image sensor according to at least one example embodiment includes a semiconductor substrate 110, a lower electrode 10 formed in the semiconductor substrate 110, an organic photoelectric conversion layer 30 positioned on one side of the semiconductor substrate 110, and a upper electrode 20 formed on one side of the organic photoelectric conversion layer 30, and the lower electrode 10, the organic photoelectric conversion layer 30, and the upper electrode 20 provide an organic photoelectric device, similarly to the example embodiment illustrated in FIG. 1.

According to at least one example embodiment, semiconductor substrate 110 may be a silicon substrate, for example a monocrystalline silicon substrate. The semiconductor substrate 110 may be integrated with a blue photo-sensing device 50B, a red photo-sensing device 50R, charge storages 55B, 55R, and 55G, and a transmission transistor (not shown).

The blue photo-sensing device 50B, the charge storage 55B, and the transmission transistor may be integrated in each blue pixel, and the blue photo-sensing device 50B may be electrically connected to the charge storage 55B through a through-hole 57B. The red photo-sensing device 50R, the charge storage 55R and the transmission transistor may be integrated in each red pixel, and the red photo-sensing device 50R may be electrically connected to the charge storage 55R through a through-hole 57R. The charge storage 55G may be electrically connected to the lower electrode 10 through a through-hole 57G.

The blue photo-sensing device 50B and the red photo-sensing device 50R may be positioned at different depths from the surface of the semiconductor substrate 110, and the red photo-sensing device 50R sensing light in a longer wavelength region may be positioned more deeply from the surface of the semiconductor substrate 110 than the blue photo-sensing device 50B sensing light in a shorter wavelength region. The blue photo-sensing device 50B and the red photo-sensing device 50R may be configured to selectively absorb light in each wavelength region depending on a stack depth.

The present embodiment includes a selectively transmitting region 80 on the red photo-sensing device 50R. The selectively transmitting region 80 is configured to selectively transmit light in a red wavelength region and to reflect or to absorb light in a blue wavelength region, and may consist of or include, for example, crystalline silicon. Herein, the crystalline silicon may be monocrystal silicon and/or polysilicon. The selectively transmitting region 80 may use a silicon substrate as is or artificially formed by a laser, without limitation, similarly to the example embodiment illustrated in FIG. 1. Accordingly, the selectively transmitting region 80 is formed on the red photo-sensing device 50R and thereby wavelength selectivity of light that flows into the red photo-sensing device increases, improving sensitivity of an image sensor and decreasing crosstalk.

The lower electrode 10 is a light-transmitting electrode positioned in each pixel, and may be a conductive layer doped with an n-type or p-type impurity at a high concentration on the surface of the semiconductor substrate 110. For example, the lower electrode 10 may be amorphous silicon doped with an n-type or p-type impurity.

The organic photoelectric conversion layer 30 selectively absorbs light in a green wavelength region and transmits light in other wavelength region, that is, light in a blue wavelength region and a red wavelength region.

The upper electrode 20 may be positioned on the organic photoelectric conversion layer 30, and may be a light-transmitting electrode into which light enters. One of the lower electrode 10 and the upper electrode 20 is an anode and the other is a cathode.

In FIG. 2, the blue photo-sensing device 50B, configured to sense light in a blue wavelength region and the red photo-sensing device 50R, configured to sense light in a red wavelength region, are integrated in the semiconductor substrate 110, the selectively transmitting region 80 is positioned on the red photo-sensing device 50R, and the organic photoelectric device 100 includes the organic photoelectric conversion layer 30 configured to selectively absorb light in a green wavelength region. However, the organic photoelectric device 100 is not limited to the above example structure shown in FIG. 2. The following structures are also included as example embodiments: a photo-sensing device configured to sense light in a blue wavelength region and a photo-sensing device configured to sense light in a green wavelength region may be integrated in the semiconductor substrate 110, a selectively transmitting region may be positioned on the photo-sensing device sensing light in a green wavelength region, and the organic photoelectric device 100 may include an organic photoelectric conversion layer selectively absorbing light in a red wavelength region. Alternatively, a photo-sensing device configured to sense light in a red wavelength region and a photo-sensing device configured to sense light in a green wavelength region may be integrated in the semiconductor substrate 110, the selectively transmitting region may be positioned on the photosensing device configured to sense light in a red wavelength region, and the organic photoelectric device 100 may include an organic photoelectric conversion layer configured to selectively absorb light in a blue wavelength region.

The image sensor according to at least one example embodiment includes the conductive layer on the surface of the semiconductor substrate 110 such that the conductive layer is used as one electrode of the organic photoelectric device 100, and thus structure thereof and process of operation may be simplified as described above. In addition, a separate insulation layer between the semiconductor substrate 110 and the organic photoelectric device 100 may be omitted in the above structure, and light absorption and/or reflection by the insulation layer may thus be decreased, reducing loss of light that flows into the semiconductor substrate.

The blue photo-sensing device 50B and the red photo-sensing device 50R integrated in the semiconductor substrate 110 may be positioned at different depths from the surface of the semiconductor substrate 110, and may selectively absorb light in each wavelength region depending on a stack depth, and thereby color separation characteristics are improved without having to add a separate organic color filter layer. Furthermore, as described above, the selectively transmitting region 80, capable of selectively transmitting light in a red wavelength region and selectively reflecting or absorbing light in a blue wavelength region, is formed on the red photo-sensing device 50R, and thereby wavelength selectivity of light that flows into the red photo-sensing device 50R increases, improving sensitivity and decreasing crosstalk.

Figure 3:
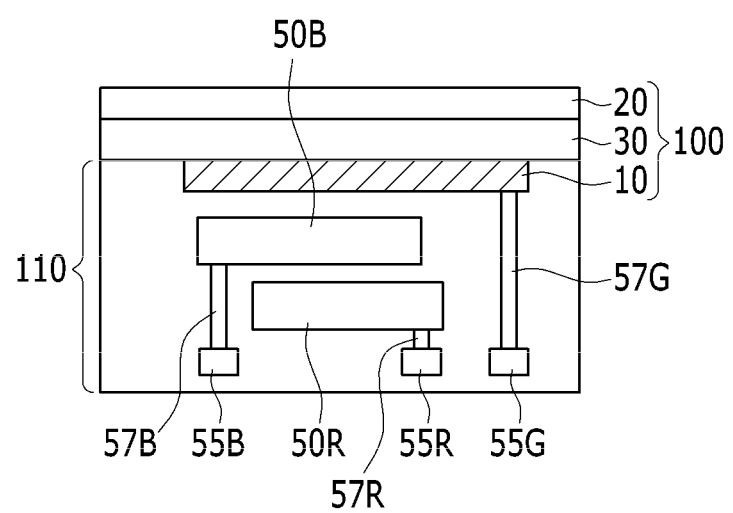
FIG. 3 is a cross-sectional view showing an image sensor according to yet another example embodiment.

FIG. 3 is a cross-sectional view showing an image sensor according to at least one example embodiment.

Referring to FIG. 3, an image sensor according to at least one example embodiment includes a semiconductor substrate 110, a lower electrode 10 formed in the semiconductor substrate 110, an organic photoelectric conversion layer 30 positioned on one side of the semiconductor substrate 110, and a upper electrode 20 formed on one side of the organic photoelectric conversion layer 30, and the lower electrode 10, the organic photoelectric conversion layer 30, and the upper electrode 20 provide an organic photoelectric device.

The semiconductor substrate 110 may be or include a silicon substrate, for example a monocrystalline silicon substrate. The semiconductor substrate 110 may be integrated with a blue photo-sensing device 50B, a red photo-sensing device 50R, charge storages 55B, 55R, and 55G, and a transmission transistor (not shown). The blue photo-sensing device 50B may be electrically connected to the charge storage 55B through a through-hole 57B, and the red photo-sensing device 50R may be electrically connected to the charge storage 55R through a through-hole 57R. The charge storage 55G may be electrically connected to the lower electrode 10 through a through-hole 57G.

The blue photo-sensing device 50B and the red photo-sensing device 50R may be positioned at different depths from the surface of the semiconductor substrate 110, and the red photo-sensing device 50R, configured to sense light in a longer wavelength region, may be positioned more deeply from the surface of the semiconductor substrate 110 than the blue photo-sensing device 50B configured to sense light in a shorter wavelength region. The blue photo-sensing device 50B and the red photo-sensing device 50R may be configured to selectively absorb light in each wavelength region depending on a stack depth.

In at least one example embodiment, the blue photo-sensing device 50B and the red photo-sensing device 50R are stacked in a vertical direction. Accordingly, the size of the image sensor may be decreased in size by stacking the blue photo-sensing device 50B and the red photo-sensing device 50R in a vertical direction.

The lower electrode 10 may be a light-transmitting electrode positioned in each pixel, and may be a conductive layer doped with an n-type or p-type impurity at a high concentration on the surface of the semiconductor substrate 110. For example, the lower electrode 10 may be or include amorphous silicon doped with an n-type or p-type impurity.

The organic photoelectric conversion layer 30 may be configured to selectively absorb light in a green wavelength region and to transmit light in other wavelength regions, that is, light in a blue wavelength region and a red wavelength region.

The upper electrode 20 may be positioned on the organic photoelectric conversion layer 30 and may be a light-transmitting electrode into which light enters. One of the lower electrode 10 and the upper electrode 20 may be an anode and the other may be a cathode.

In FIG. 3, the blue photo-sensing device 50B sensing light in a blue wavelength region and the red photo-sensing device 50R sensing light in a red wavelength region are stacked in a vertical direction in the semiconductor substrate 110, and the organic photoelectric device 100 includes the organic photoelectric conversion layer 30 selectively absorbing light in a green wavelength region. However, the organic photoelectric device 100 is not limited to the example embodiment illustrated in FIG. 3. The example embodiments may include a photo-sensing device configured to sense light in a blue wavelength region and a photo-sensing device configured to sense light in a green wavelength region may be stacked vertically in the semiconductor substrate 110, and the organic photoelectric device 100 may include an organic photoelectric conversion layer configured to selectively absorb light in a red wavelength region. Alternatively, a photo-sensing device configured to sense light in a red wavelength region and a photo-sensing device configured to sense light in a green wavelength region may be stacked vertically in the semiconductor substrate 110, and the organic photoelectric device 100 may include an organic photoelectric conversion layer selectively absorbing light in a blue wavelength region.

The image sensor according to at least one example embodiment includes the conductive layer on the surface of the semiconductor substrate 110 such that the conductive layer is used as one electrode of the organic photoelectric device 100, and thus the structure thereof and process of operation may be simplified as described above. In addition, a separate insulation layer between the semiconductor substrate 110 and the organic photoelectric device 100 may be omitted, and light absorption and/or reflection by the insulation layer may be decreased, reducing loss of light that flows into the semiconductor substrate.

The blue photo-sensing device 50B and the red photo-sensing device 50R integrated in the semiconductor substrate 110 may be positioned at different depths from the surface of the semiconductor substrate 110, and may selectively absorb light in each wavelength region depending on a stack depth, and thereby a separate color filter layer may not be added. Furthermore, as described above, the blue photo-sensing device 50B and the red photo-sensing device 50R are stacked in a vertical direction, and thereby a size of an image sensor may be further reduced to realize a downsized image sensor.

Figure 4:
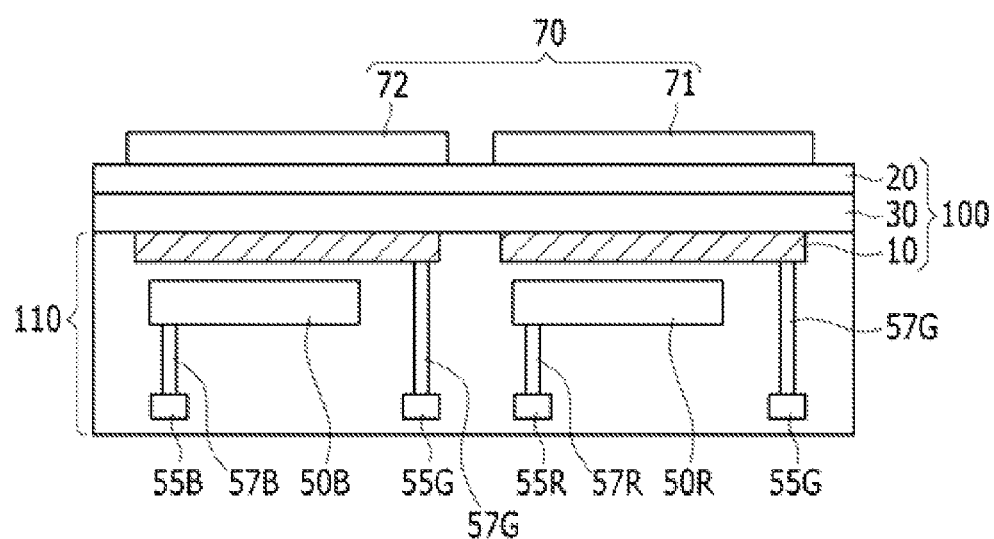
FIG. 4 is a cross-sectional view showing an image sensor according to still another example embodiment.

FIG. 4 is a cross-sectional view showing an image sensor according to at least one example embodiment.

Referring to FIG. 4, an image sensor according to at least one example embodiment includes a semiconductor substrate 110, a lower electrode 10 formed in the semiconductor substrate 110, an organic photoelectric conversion layer 30 positioned on one side of the semiconductor substrate 110, and a upper electrode 20 formed on one side of the organic photoelectric conversion layer 30, and the lower electrode 10, the organic photoelectric conversion layer 30, and the upper electrode 20 provide an organic photoelectric device.

The semiconductor substrate 110 may be a silicon substrate, for example a monocrystalline silicon substrate. The semiconductor substrate 110 may be integrated with a blue photo-sensing device 50B, a red photo-sensing device 50R, charge storages 55B, 55R, and 55G, and a transmission transistor (not shown). The blue photo-sensing device 50B may be electrically connected to the charge storage 55B through a through-hole 57B and the red photo-sensing device 50R may be electrically connected to the charge storage 55R through a through-hole 57R. The charge storage 55G may be electrically connected to the lower electrode 10 through a through-hole 57G.

In an example embodiment, the blue photo-sensing device 50B and the red photo-sensing device 50R are spaced apart in a horizontal direction at substantially equivalent depths from the surface of the semiconductor substrate 110.

The lower electrode 10 may be a light-transmitting electrode positioned in each pixel, and may be a conductive layer doped with an n-type or p-type impurity at a high concentration on the surface of the semiconductor substrate 110. For example, the lower electrode 10 may be amorphous silicon doped with an n-type or p-type impurity.

The organic photoelectric conversion layer 30 may be configured to selectively absorb light in a green wavelength region and transmit light in other wavelength regions, that is, light in a blue wavelength region and a red wavelength region.

The upper electrode 20 may be positioned on the organic photoelectric conversion layer 30 and may be a light-transmitting electrode into which light enters. One of the lower electrode 10 and the upper electrode 20 is an anode and the other is a cathode.

In at least one example embodiment, a color filter layer 70 is on the upper electrode 20. The color filter layer 70 may include a first color filter 71 that is positioned corresponding to the red photo-sensing device 50R and configured to selectively transmit light in a red wavelength region and light in a green wavelength region, and a second color filter 72 that is positioned corresponding to the second photo-sensing device 50B and configured to selectively transmit light in a blue wavelength region and light in a green wavelength region. For example, the first color filter 71 may be a yellow filter and the second color filter 72 may be a cyan filter.

In FIG. 4, the blue photo-sensing device 50B configured to sense light in a blue wavelength region and the red photo-sensing device 50R configured to sense light in a red wavelength region are integrated in the semiconductor substrate 110, the organic photoelectric device 100 includes the organic photoelectric conversion layer 30 configured to selectively absorb light in a green wavelength region, the first color filter 71 configured to sense selectively transmit light in a red wavelength region and in a green wavelength region, and the second color filter 72 configured to selectively transmit light in a blue wavelength region and in a green wavelength region. However, the organic photoelectric device 100 is not limited to the above structure shown in FIG. 4. Example embodiments may include a photo-sensing device sensing light in a blue wavelength region and a photo-sensing device sensing light in a green wavelength region integrated in the semiconductor substrate 110, the organic photoelectric device 100 may include an organic photoelectric conversion layer selectively absorbing light in a red wavelength region, a color filter selectively transmitting light in a blue wavelength region and in a red wavelength region, and a color filter selectively transmitting light in a green wavelength region and in a red wavelength region. Alternatively, a photo-sensing device sensing light in a red wavelength region and a photo-sensing device sensing light in a green wavelength region may be integrated in the semiconductor substrate 110, the organic photoelectric device 100 may include an organic photoelectric conversion layer selectively absorbing light in a blue wavelength region, a color filter selectively transmitting light in a red wavelength region and in a blue wavelength region, and a color filter selectively transmitting light in a green wavelength region and in a blue wavelength region.

The image sensor according to at least one example includes the conductive layer on the surface of the semiconductor substrate 110 such that the conductive layer is used as one electrode of the organic photoelectric device 100, and thus a structure thereof and process of operation may be simplified as described above. In addition, a separate insulation layer between the semiconductor substrate 110 and the organic photoelectric device 100 may not be formed by the above structure, and light absorption and/or reflection by the insulation layer are decreased, reducing loss of light that flows into the semiconductor substrate.

The image sensor may be applied to various electronic devices, for example a mobile phone, a digital camera, a biosensor, and the like, without limitation.

While this disclosure has been described in connection with what is presently considered to be practical example embodiments, it is to be understood that the example embodiments are not limited to the disclosed embodiments, but, on the contrary, are intended to cover various modifications and equivalent arrangements included within the spirit and scope of the appended claims.

What is claimed is:

1. An image sensor comprising:
   a semiconductor substrate including at least one photo-sensing device configured to sense a wavelength;
   an impurity-doped first light-transmitting electrode in the semiconductor substrate;
   an organic photoelectric conversion layer on the semiconductor substrate and configured to absorb light in a different wavelength from the wavelength sensed by the photo-sensing device; and
   a second light-transmitting electrode on the organic photoelectric conversion layer;
   wherein the impurity-doped first light-transmitting electrode, the organic photoelectric conversion layer, and the second light-transmitting electrode form an organic photoelectric device, and
   one of the impurity-doped first light-transmitting electrode and the second light-transmitting electrode is an anode of the organic photoelectric device, and the other of the impurity-doped first light-transmitting electrode and the second light-transmitting electrode is a cathode of the organic photoelectric device.

2. The image sensor of claim 1, wherein the impurity-doped first light-transmitting electrode comprises n-type or p-type impurity-doped amorphous silicon.

3. The image sensor of claim 2, wherein the impurity-doped first light-transmitting electrode has a thickness of about 2 nm to about 50 nm.

4. The image sensor of claim 1, wherein the photo-sensing device integrated in the semiconductor substrate comprises a first photo-sensing device configured to sense light in a first wavelength region, and a second photo-sensing device configured to sense light in a second wavelength region that is different from the first wavelength region, wherein the organic photoelectric conversion layer is configured to absorb light in a third wavelength region that is different from the first wavelength region and the second wavelength region.

5. The image sensor of claim 4, wherein the first photo-sensing device and the second photo-sensing device are at different depths from the surface of the semiconductor substrate.

6. The image sensor of claim 5, wherein the first photo-sensing device is configured to sense light in a longer wavelength region than the second photo-sensing device, and the first photo-sensing device is deeper from the surface of the semiconductor substrate than the second photo-sensing device.

7. The image sensor of claim 4, further comprising a selectively transmitting region between the first photo-sensing device and the impurity-doped first light-transmitting electrode.

8. The image sensor of claim 7, wherein the selectively transmitting region is configured to selectively transmit light in the first wavelength region and is configured to selectively reflect or absorb light in the second wavelength region.

9. The image sensor of claim 7, wherein the selectively transmitting region comprises crystalline silicon.

10. The image sensor of claim 7, wherein the impurity-doped first light-transmitting electrode comprises amorphous silicon, and the selectively transmitting region includes crystalline silicon.

11. The image sensor of claim 4, further comprising a color filter layer on one side of the second light-transmitting electrode.

12. The image sensor of claim 11, wherein the color filter layer comprises:

a first color filter in correspondence with the first photo-sensing device and configured to selectively transmit light in the first wavelength region and the third wavelength region, and a second color filter in correspondence with the second photo-sensing device and configured to selectively transmit light in the second wavelength region and the third wavelength region.

13. The image sensor of claim 11, wherein the first photo-sensing device and the second photo-sensing device are spaced apart in a horizontal direction.

14. The image sensor of claim 1, wherein no insulation layer is between the semiconductor substrate and the organic photoelectric conversion layer.

15. The image sensor of claim 1, wherein no organic color filter is between the semiconductor substrate and the organic photoelectric conversion layer.

16. The image sensor of claim 4, wherein the first wavelength region, the second wavelength region, and the third wavelength region are one of three primary colors in a visible wavelength region.

17. The image sensor of claim 16, wherein the first wavelength region is a red wavelength region, the second wavelength region is a blue wavelength region, and the third wavelength region is a green wavelength region.

18. The image sensor of claim 17, wherein the red wavelength region has a maximum absorption wavelength ($\lambda_{max}$) that is greater than about 580 nm and less than or equal to about 700 nm, the blue wavelength region has a maximum absorption wavelength ($\lambda_{max}$) that is greater than or equal to about 400 nm and less than about 500 nm, and the green wavelength region has a maximum absorption wavelength ($\lambda_{max}$) that is about 500 nm to about 580 nm.

19. An electronic device including the image sensor of claim 1.

20. The image sensor of claim 1, wherein the impurity-doped first light-transmitting electrode is in electrical contact with the organic photoelectric conversion layer.

* * * * *